(12) United States Patent
Hwu et al.

(10) Patent No.: US 7,186,652 B2
(45) Date of Patent: Mar. 6, 2007

(54) METHOD FOR PREVENTING CU CONTAMINATION AND OXIDATION IN SEMICONDUCTOR DEVICE MANUFACTURING

(75) Inventors: Boq-Kang Hwu, Tainan (TW); Chung-Shi Liu, Hsin-Chu (TW); Chen-Hua Yu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/840,049

(22) Filed: May 5, 2004

(65) Prior Publication Data

US 2005/0250332 A1    Nov. 10, 2005

(51) Int. Cl.
    *H01L 21/461* (2006.01)
(52) U.S. Cl. ...................... 438/692; 438/687
(58) Field of Classification Search ........... 438/692, 438/700, 712, 773, 770, 680, 681
    See application file for complete search history.

(56) References Cited

U.S. PATENT DOCUMENTS

| 6,065,424 | A | * | 5/2000 | Shacham-Diamand et al. | 118/696 |
| 6,207,247 | B1 | | 3/2001 | Morita | 428/64.1 |
| 6,217,667 | B1 | * | 4/2001 | Jolley | 134/2 |
| 6,632,288 | B2 | * | 10/2003 | Jolley | 134/2 |
| 2002/0127825 | A1 | | 9/2002 | Mui et al. | 438/474 |

* cited by examiner

*Primary Examiner*—David Nhu
(74) *Attorney, Agent, or Firm*—Tung & Associates

(57) ABSTRACT

A method for reducing or preventing contamination or oxidation of copper surfaces included in semiconductor process wafers including providing a semiconductor wafer including copper features having newly formed process surfaces following a semiconductor manufacturing process forming the newly formed process surfaces; exposing the process surfaces to an alkaline solution for a period of time sufficient to chemically modify the newly formed process surfaces prior to substantial exposure of the process surfaces to a contaminating or oxidizing atmosphere; and, placing the semiconductor wafer in a semiconductor wafer holding environment in queue for subsequent semiconductor manufacturing processes.

19 Claims, 2 Drawing Sheets

METHOD FOR PREVENTING CU CONTAMINATION AND OXIDATION IN SEMICONDUCTOR DEVICE MANUFACTURING

FIELD OF THE INVENTION

This invention generally relates to semiconductor manufacturing processes where copper is used as an electrical conductor in semiconductor device features and more particularly to a method for preventing contamination and oxidation of the copper features during and following manufacturing processes.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings in multi-layer semiconductor devices. Typically, electroplating (electrodeposition) uses an electrolyte including positively charged ions of deposition material, for example metal ions, in contact with a negatively charged substrate (cathode) having a source of electrons to deposit (plate out) the metal ions onto the charged substrate, for example, a semiconductor wafer. A thin metal layer (seed layer) is first conformally deposited onto the semiconductor wafer to form a liner in high aspect ratio anisotropically etched features to provide a continuous electrical path across the surfaces. An electrical current is supplied to the seed layer whereby the semiconductor wafer surface including etched features are electroplated with an appropriate metal, for example, aluminum or copper, to fill the features.

One exemplary process for forming a series of electrically interconnected multiple layers, for example, is a damascene or dual damascene process. Although there are several different manufacturing methods for manufacturing damascene structures, all such methods employ a series of photolithographic masking and etching steps, typically by a reactive ion etch (RIE). In the typical multi-layer semiconductor manufacturing process, for example, a series insulating layers are deposited to include a series of interconnecting metal-filled features such as vias and trench lines to electrically interconnect the various layers and areas within layers in the multilayer device. In most devices, pluralities of vias are separated from one another within an insulating layer included in the semiconductor wafer and selectively interconnect conductive regions between layers of a multi-layer device. Trench lines typically serve to selectively interconnect conductive regions within a layer of a multi-layer device. Vias and trench lines are selectively interconnected in order to form the necessary electrical connections to power the semiconductor device.

In filling the via openings and trench line openings with metal, for example copper, electroplating is a preferable method to achieve superior step coverage of sub-micron etched features. The method generally includes first depositing a barrier layer over the etched opening surfaces, such as via openings and trench line openings, depositing a metal seed layer, for example copper, over the barrier layer, and then electroplating a metal, for example copper, over the seed layer to fill the etched features to form conductive vias and trench lines. The electrodeposited copper layer, the barrier layer, and the insulating layer are then planarized, for example, by chemical mechanical polishing (CMP), to define a conductive interconnect feature within a layer of a multi-layer semiconductor device. Metal electroplating (electrodeposition) in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The electrodeposition surface is contacted with an electrical power source to form the cathode of the plating system such that ions in the plating solution deposit on the conductive portion of the electrodeposition surface, for example a semiconductor wafer surface.

More recent electroplating (electrodeposition) processes use self contained assemblies where the anode and semiconductor wafer are in close proximity to carry out both electroplating and electropolishing. Typically the semiconductor wafer surface is spaced apart from the anode in the electroplating solution during electrodeposition and contacts the anode during the electropolishing process where the electrolyte current is reversed and semiconductor wafer becomes the anode and the anode acts as a cathode. The electrolyte used in the electrodeposition and electropolishing process typically contains sulfur containing compounds such as sulfates, sulfites, and thiols and may optionally include various complexing agents including ammonia and organic compounds to aid the electrodeposition or electropolishing process. Following the electrodeposition process and electropolishing process, the semiconductor wafer surface is typically rinsed, for example, with deionized water and dried, for example, according to a wafer spinning process.

One problem with the prior art semiconductor processing methods involving rinsing and drying steps following copper electrodeposition, is that the rinsing and drying process is not fully effective in removing contaminants in the rinsing process. For example, copper features that are formed according to an electrodeposition process typically contain sulfur impurities which can react with residual moisture to form sulfuric acid thereby having a corrosive effect on semiconductor features including copper layers. It is believed that this corrosive process is at least in part responsible for subsequent semiconductor wafer defects including peeling of copper layers and lifting of copper pads deposited according to electrodeposition processes. Such peeling and lifting of copper features detrimentally affects semiconductor wafer yield and device reliability.

In addition, copper containing features in general, following exposure of an unoxidized copper containing surface, for example, following copper layer deposition, and copper CMP polishing processes, are susceptible to oxidation, forming for example, $CuO$, $Cu_2O$, and $CuO_2$, from exposure to oxygen containing atmospheres or oxidizing agents frequently included in CMP polishing compounds. In addition, the unoxidized copper surfaces are susceptible in general to contaminants present to some degree in manufacturing environmental atmospheres, for example, organics, ammonia, and sulfur containing compounds. In general, oxidation and contamination of copper containing semiconductor feature surfaces may lead to degradation of electrical performance by increasing contact resistances and facilitating electromigration thereby causing device yield and reliability concerns.

These and other shortcomings demonstrate a need in the semiconductor processing art to develop a method for reducing or preventing contamination and oxidation of copper containing semiconductor feature surfaces.

It is therefore an object of the invention to provide a method for reducing or preventing contamination and oxidation of copper containing semiconductor feature surfaces while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for reducing or preventing contamination or oxidation of copper surfaces included in semiconductor process wafers.

In a first embodiment, the method includes providing a semiconductor wafer including copper features having newly formed process surfaces following a semiconductor manufacturing process forming the newly formed process surfaces; exposing the process surfaces to an alkaline solution for a period of time sufficient to chemically modify the newly formed process surfaces prior to substantial exposure of the process surfaces to a contaminating or oxidizing atmosphere; and, placing the semiconductor wafer in a semiconductor wafer holding environment in queue for subsequent semiconductor manufacturing processes.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
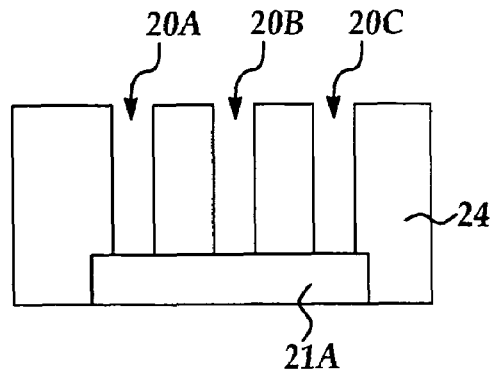
FIGS. 1A–1E are cross sectional side view representation of a portion of one level in a multi-level semiconductor device showing the formation of exemplary copper containing semiconductor features (vias) at sequential stages of manufacture in an exemplary process according to the present invention.

In the method and apparatus according to the present invention, the invention is explained by reference to an electrodeposition or electropolishing process where an anisotropically etched semiconductor features included in a semiconductor process wafer is electroplated with copper to fill the feature and a subsequent chemical mechanical polishing (CMP) process to remove excess copper deposited over the semiconductor feature. It will be appreciated, however, that the method of the present invention may be used advantageously during or following any semiconductor manufacturing process where any newly formed exposed copper surface is treated according to the present invention to minimize subsequent contamination and oxidation of the copper surface. For example, the newly formed copper surfaces may be formed by electroplating or electroless plating (electrodeposition) as well as physical vapor deposition (PVD) or chemical vapor deposition (CVD processes. In addition, the newly formed copper surfaces may be formed by any planarization process including plasma or chemical etching as well as chemical mechanical polishing (CMP). It will be further appreciated that the term 'copper' as used herein includes copper or alloys thereof.

In a first embodiment of the present invention, in a semiconductor manufacturing process including copper containing features having newly formed exposed copper surfaces included in a semiconductor wafer process surface is treated with an alkaline solution, preferably ammonia free having a pH of between about 7.5 and about 9.5. The process surface may be treated by any conventional means for applying a solution to a semiconductor wafer process surface including dipping, spraying, or spin-coating. Preferably, the process surface is treated for a period of time to chemically modify exposed copper surfaces included therein. By the term 'chemically modify' is meant to include at least partial hydroxylation of the newly formed exposed copper surfaces.

For example, it has been found that treatment of the exposed copper surfaces included in the process surface with an alkaline solution with the preferred pH range acts to reduce contamination and prevent the formation of other contaminating species, for example, sulfur containing chemical species contamination. It is believed that treatment of the copper surfaces with an alkaline solution, among other processes, acts to reduce the rate of formation of hydrogen sulfide ($H_2S$) thereby minimizing acidic corrosion of copper features. In addition, although not fully understood, it is believed that treatment of the copper surfaces with the alkaline solution acts to chemically modify including at least partially hydroxylating the copper surfaces thereby reducing subsequent copper surface interaction with environmental species including oxygen and sulfur containing species thereby reducing surface contamination and surface oxidation rates. As a result, semiconductor process wafers may be stored in environmentally controlled holding areas for a longer period of time between manufacturing processes while minimizing increased surface oxidation or contamination.

In one embodiment of the invention, the semiconductor wafer including exposed copper surfaces is dipped in the alkaline solution for a period of from about 30 seconds to about 120 seconds, more preferably, from about 45 seconds to about 90 seconds. Preferably, the exposed copper surfaces are treated with the alkaline solution as soon as practicable including substantially immediately following exposure of copper surfaces e.g., copper layer deposition, preferably prior to substantial exposure of the process surface to a contaminating or oxidizing atmosphere. By the term 'substantially immediately' is meant within a time period as soon as practicable following deposition or formation of the exposed copper surfaces including routine wafer transfer and rinsing steps. For example, preferably, the exposed copper surfaces are treated with the alkaline solution prior to substantial exposure to an atmospheric environment including contaminants, for example, greater than about 10 ppb. For example, substantial exposure may include time periods of from about 10 minutes to about 60 minutes depending on any intervening rinsing steps carried out and the level of contaminants and oxygen in the environmental atmosphere.

In another embodiment, the alkaline solution includes deionized water and at least one ammonia free base, for example, sodium hydroxide (NaOH). The base is preferably ammonia free as it has been found that ammonia may lead to the formation of ammonia sulfide (e.g., $(NH_4)_2S$) with sulfur contaminants present on the process surface. It will be appreciated that the amount of sodium hydroxide, for example, added to deionized water will vary depending on the amount of deionized water, however, it will be appreciated that an appropriate amount is added to bring the pH of the solution within a range of about 7.5 to about 9.5. Another suitable alkaline solution includes a commercially available solution, ST-250, having a pH range of about 7.5 to about 9.0, manufactured by ATMI.

In one exemplary embodiment of the present invention, exposed copper surfaces including a copper seed layer is treated with the alkaline solution following copper seed layer deposition and prior to electrodeposition. For example, referring to FIG. 1A, is shown a cross-sectional representation of a portion of the process wafer at one level of a multi-level semiconductor device including exemplary via structures. In an exemplary process via openings e.g., 20A, 20B, 20C and are formed in an intermetal dielectric (IMD) layer 24. The IMD layer 24 including the via openings e.g., 20A, 20B, 20C, is for example, formed of a low-k material, for example, carbon doped silicon dioxide, with a dielectric constant of less than about 3.0. The IMD layer 24 is typically formed by conventional CVD processes including PECVD and HDP-CVD with the IMD layer 24 typically about 3000 to about 10,000 Angstroms in thickness. Deposited over the (IMD) layer 24, there is typically formed an etch stop layer (not shown), preferably silicon nitride (SiN), and a dielectric antireflective coating (DARC) layer (not shown), preferably silicon oxynitride (e.g., SiON), for reducing undesirable light reflections in the photolithographic patterning process to define the via openings. Following photolithographic patterning, a conventional anisotropic reactive ion etch (RIE) (plasma etching) step is carried out to form the via openings e.g., 20A, 20B, 20C in IMD layer 24. The via openings are etched to form closed communication with an underlying conductive area e.g., 21A, formed of, for example, copper.

Figure 1B:
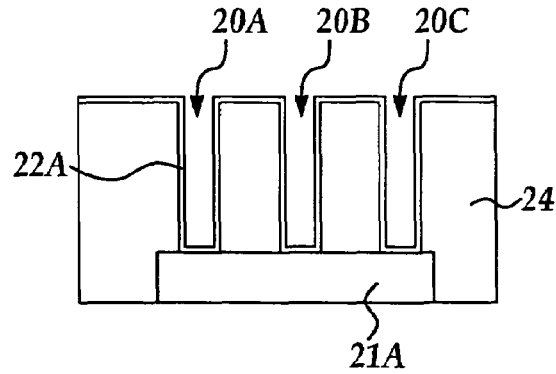

Referring to FIG. 1B, prior to filling the via openings e.g., 20A, 20B, 20C, with copper, typically a barrier/adhesion layer 22A of, for example, tantalum nitride (TaN) is conformally deposited over the dummy via openings e.g., 20A, 20B, 20C to include lining the via walls and via floor. The barrier/adhesion layer 22A is typically formed to prevent diffusion of the copper into the insulating IMD layer 24. The barrier/adhesion layer 22A is formed by a conventional CVD process known in the art for depositing, for example, tantalum nitride. The barrier/adhesion layer 22A preferably has a thickness between about 25 Angstroms and about 400 Angstroms.

Figure 1C:
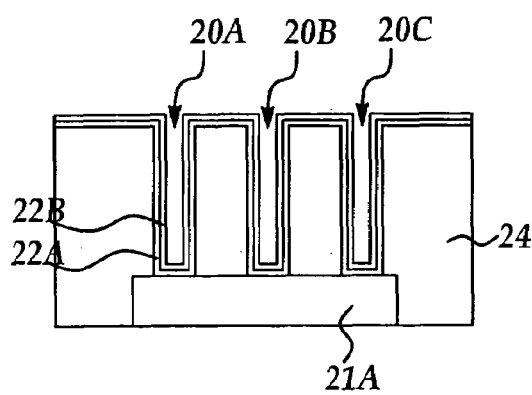

Referring to FIG. 1C, prior to performing an electroplating process to fill the via openings e.g., 20A, 20B, 20C, with copper, a copper seed layer 22B is deposited over the barrier/adhesion layer 22A. The copper seed layer 22B provides improved adhesion for the subsequently electrodeposited copper layer as well as a conformal conductive layer for electrodeposition of an overlying copper layer. The copper seed layer 22B may be formed by a conventional CVD or PVD process. The thickness of the copper seed layer 22B typically varies between about 300 angstroms and 1000 angstroms.

Following deposition of the copper seed layer 22B, according to the present invention, the semiconductor wafer process surface including the copper seed layer having a newly formed exposed copper surface is subjected to the alkaline solution treatment according to the present invention. Preferably, the semiconductor wafer, for example, in a semiconductor wafer batch process, is dipped in the alkaline solution for a period of from about 30 to about 120 seconds, more preferably from about 45 seconds to about 90 seconds. Alternatively, the alkaline surface treatment may proceed by any combination of dipping and spraying. Optionally, the process surface including copper seed layer 22B is rinsed with deionized water by dipping or spraying prior to application of the alkaline solution. However, the alkaline solution treatment may substitute for the rinsing step, the alkaline solution acting as the rinsing solution in addition to chemically modifying the exposed surface of the copper seed layer.

Figure 2A:
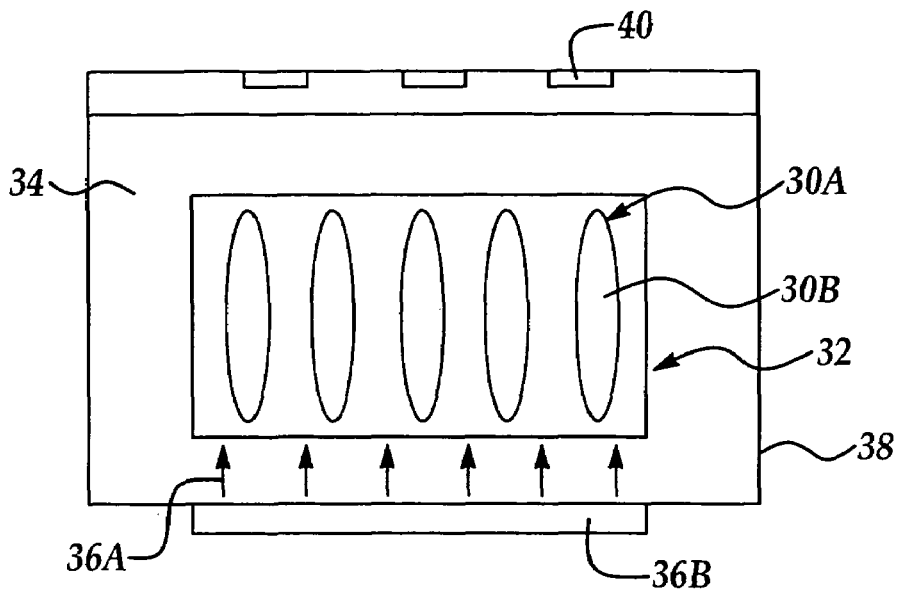
FIG. 2A is a cross sectional side view representation of an exemplary apparatus for carrying out dipping and simultaneous application of megasonic energy in the alkaline solution treatment according to one embodiment of the present invention.

Referring to FIG. 2A, is shown an exemplary batch wafer dipping apparatus equipped with a conventional megasonic energy source to optionally applied simultaneously with the dipping process to provide more intimate contact of the alkaline solution with the wafer process surface. Preferably, a conventional megasonic cleaning process is used as the sonic energy source which includes a transducer producing sonic energy at a frequency of about 850 to 900 kHz. The sonic energy is preferably directed parallel to the semiconductor wafer surfaces. In exemplary operation, referring to FIG. 2A, semiconductor wafers e.g., 30A having surfaces e.g., 30B are held in cassette 32 immersed in the alkaline solution 34 such that semiconductor wafer surfaces e.g., 30B are oriented parallel to the direction of travel of the sonic waves indicated by directional arrows, e.g., 36A, produced by transducer 36B, typically mounted against the outside of solution container 38. Fresh alkaline solution may be added at the top portion of container 38 through solution supply feeds e.g., 40.

In another embodiment, the alkaline solution may be sprayed onto the process surface of the wafer in a conventional wafer spinning method, for example, by spraying a stream of the alkaline solution onto the wafer for about 30 seconds to about 90 seconds while spinning the wafer at from about 800 to about 2400 rpm.

Following the alkaline solution treatment the semiconductor wafer is optionally temporarily stored in preparation of the next semiconductor manufacturing process (queued) in a semiconductor wafer holding environment. Preferably, the wafer holding environment is sealed, for example, hermetically sealed, optionally supplied with an inert gas purge, for example, of high purity (>99.99%) nitrogen or argon.

Figure 1D:
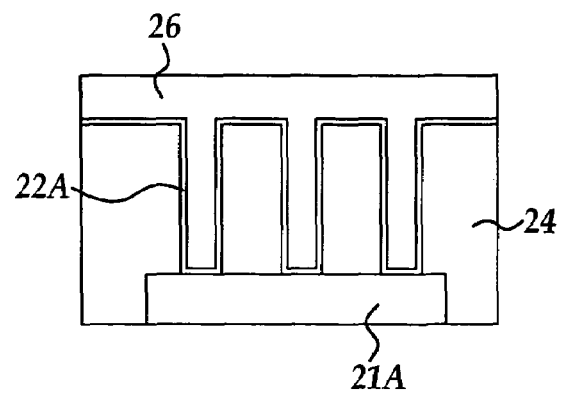

Referring to FIG. 1D, copper layer 26, is deposited, for example, by conventional electrodeposition methods over the copper seed layer (not shown) to completely fill the via openings e.g., 20A, 20B, 20C, the copper layer including a portion overlying the IMD layer 24 and barrier/adhesion layer 22A.

Following electrodeposition of copper layer 26, according to the present invention, the semiconductor wafer including the copper layer is preferably subjected to the alkaline solution treatment according to the present invention prior to carrying out a copper CMP process. Preferably, the alkaline solution treatment is applied according the preferred embodiments outlined for the alkaline solution treatment process following deposition of the copper seed layer. Optionally, the process surface including copper layer 26 is rinsed with deionized water by dipping or spraying prior to application of the alkaline solution. However, the alkaline solution treatment may substitute for the rinsing step, the alkaline solution additionally fulfilling the rinsing function. Following the alkaline surface treatment by dipping or spraying according to the preferred embodiments, the semiconductor wafer is preferably dried, for example, by a conventional wafer spinning process including an optional stream of gas directed at the process surface. Preferably, if a stream of gas is used, a high purity gas, for example >99.99% purity is used.

Following the alkaline solution treatment the semiconductor wafer is optionally temporarily stored in preparation of the next semiconductor manufacturing process (e.g., queued) in a semiconductor wafer holding environment as previously described in the queue process following deposition of the copper seed layer.

Figure 1E:
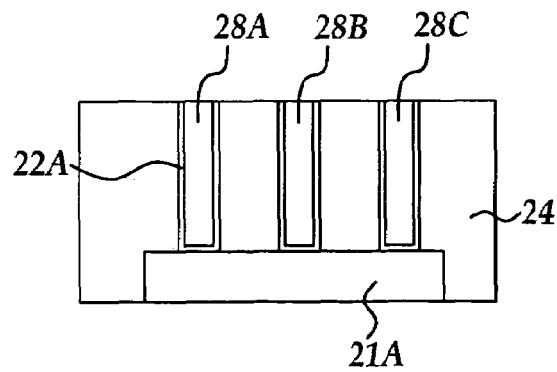

Referring to FIG. 1E, following the electroplating process, the copper layer 26 is then planarized, preferably by a conventional chemical mechanical polishing (CMP) process to remove excess copper overlying the IMD layer 24 and to define metal filled features. During the CMP process, portions of the copper layer 26, copper seed layer 22B, and barrier layer 22A are removed from the upper process surface leaving a globally planar process surface including copper filled vias e.g., 28A, 28B, 28C.

Following the CMP process, the semiconductor process surface including copper containing semiconductor features, e.g., vias 28A, 28B, 28C, is subjected to the alkaline solution treatment in the same manner as outlined for the alkaline solution treatment following copper seed layer deposition and copper layer electrodeposition. Following the alkaline solution treatment the semiconductor wafer is optionally temporarily stored in preparation of the next semiconductor manufacturing process (e.g., queued) in a semiconductor wafer holding environment as previously described following the alkaline solution treatments performed following the copper seed layer deposition and copper layer electrodeposition.

Figure 2B:
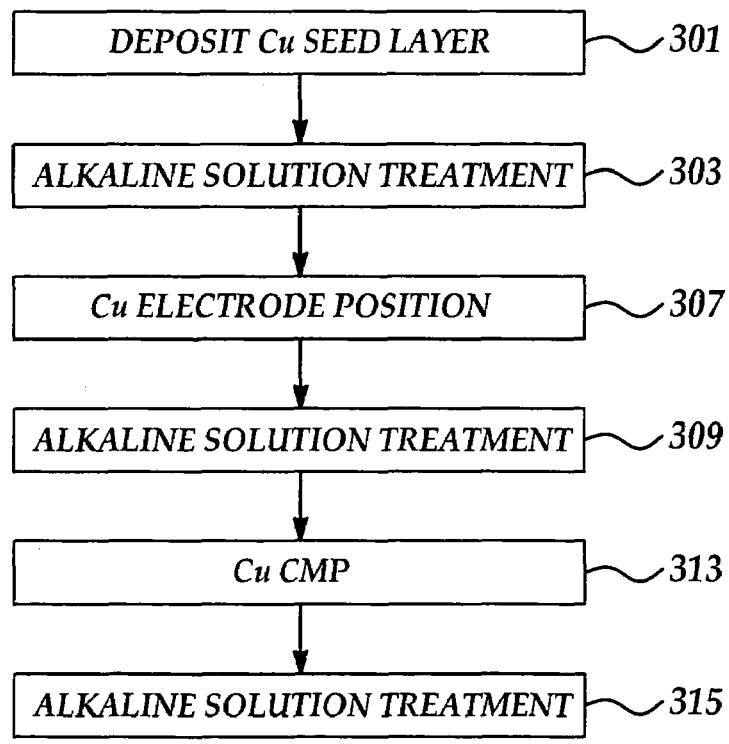
FIG. 2B is a process flow diagram encompassing several embodiments of applying the alkaline surface treatment to copper containing semiconductor features according to the present invention.

Referring to FIG. 2B is shown a process diagram including several embodiments of the present invention including the alkaline solution treatment. In process 301, a copper seed layer is deposited to line anisotropically etched semiconductor features, e.g., vias, substantially immediately followed by an alkaline solution treatment 303 according to the present invention prior to substantial exposure of the copper seed layer to an oxidizing or contaminating atmosphere including a controlled environment. Following the alkaline solution treatment the semiconductor wafer is queued (temporarily stored) in process 305 in a controlled environment, for example, a sealed (e.g., hermetically) semiconductor wafer holding container having an inert gas purge of, for example, high purity (>99.99%) nitrogen or argon.

Next the semiconductor wafer is subjected to an electrodeposition (e.g., electroplating) process 307 to electrodeposit a layer of copper metal to fill the anisotropically etched semiconductor features followed substantially immediately by an alkaline solution treatment 309 according to the present invention prior to substantial exposure of the process surface to a contaminating or oxidizing atmosphere including a controlled environment. Following the alkaline solution treatment the semiconductor wafer is queued (stored) in process 311 in a controlled environment, for example, a sealed semiconductor wafer holding container having a high purity inert gas purge.

Next the semiconductor wafer is subjected to an copper CMP process 313 to remove excess copper overlying the IMD layer surface and to define the copper filled vias followed substantially immediately by an alkaline solution treatment 315 according to the present invention prior to substantial exposure of the process surface to a contaminating or oxidizing atmosphere including a controlled environment. Following the alkaline solution treatment the semiconductor wafer is queued (stored) in process 317 in a controlled environment, for example, a sealed semiconductor wafer holding container having a high purity inert gas purge.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing or preventing contamination or oxidation of copper surfaces included in semiconductor process wafers comprising the steps of:
   providing a semiconductor wafer including copper features having newly formed process surfaces following a semiconductor manufacturing process forming the newly formed process surfaces;
   exposing the process surfaces to an alkaline solution having a pH of from about 7.5 to about 9.5 for a period of time sufficient to chemically modify the newly formed process surfaces prior to substantial exposure of the process surfaces to a contaminating or oxidizing atmosphere; and,
   placing the semiconductor wafer in a semiconductor wafer holding environment in queue for subsequent semiconductor manufacturing processes.

2. The method of claim 1, wherein the semiconductor manufacturing process includes at least one of copper seed layer deposition, copper layer electrodeposition, and copper chemical mechanical polishing.

3. The method of claim 1, wherein the step of providing a semiconductor wafer includes a semiconductor wafer having residual sulfur containing contaminants.

4. The method of claim 1, wherein the alkaline solution includes deionized water and at least one ammonia free base.

5. The method of claim 4, wherein the at least one ammonia free base includes sodium hydroxide.

6. The method of claim 1, wherein the step of exposing the process surfaces to an alkaline solution includes at least one of a dipping and spraying process.

7. The method of claim 6, wherein the dipping process is carried-out with simultaneous application of megasonic energy and the spraying process carried out with simultaneous spinning of the semiconductor wafer.

8. The method of claim 1, wherein the step of exposing the process surfaces to an alkaline solution is carried out substantially immediately following formation of the newly formed process surfaces.

9. The method of claim 1, wherein the period of time is from about 30 seconds to about 120 seconds.

10. The method of claim 1, wherein the step of placing the semiconductor wafer in a semiconductor wafer holding environment includes placing the semiconductor wafer in a hermetically sealed container supplied with an inert gas purge.

11. A method for reducing or avoiding contamination or oxidation of copper surfaces included in semiconductor process wafers comprising the steps of:
providing a semiconductor wafer including copper features having exposed process surfaces following a semiconductor manufacturing process exposing the process surfaces; and,
subjecting the exposed process surfaces substantially immediately following the semiconductor manufacturing process to an ammonia free alkaline solution for a period of time sufficient to at least partially hydroxylate the exposed process surfaces.

12. The method of claim 11, wherein the semiconductor manufacturing process includes at least one of copper seed layer deposition, copper layer electrodeposition, and copper chemical mechanical polishing.

13. The method of claim 11, wherein the alkaline solution has a pH of from about 7.5 to about 9.5.

14. The method of claim 13, wherein the alkaline solution includes deionized water and at least one ammonia free base.

15. The method of claim 14, wherein the at least one ammonia free base includes sodium hydroxide.

16. The method of claim 11, wherein the period of time includes a time period of from about 30 seconds to about 120 seconds.

17. The method of claim 11, wherein the step of subjecting the exposed process surfaces includes at least one of a dipping and spraying process.

18. The method of claim 17, wherein the dipping process is carried out with simultaneous application of megasonic energy and the spraying process carried out with simultaneous spinning of the semiconductor wafer.

19. The method of claim 11, further including the step of placing the semiconductor wafer in a semiconductor wafer holding environment including a hermetically sealed container supplied with an inert gas purge.

* * * * *